United States Patent [19]

Newburgh

[11] 4,101,452

[45] Jul. 18, 1978

[54] LEAD SULFIDE ACTIVATION PROCESS

[75] Inventor: Ronald G. Newburgh, Brookline, Mass.

[73] Assignee: Electronics Corporation of America, Cambridge, Mass.

[21] Appl. No.: 464,603

[22] Filed: Oct. 25, 1954

Related U.S. Application Data

[63] Continuation-in-part of Ser. No. 311,949, Sep. 27, 1952, which is a continuation-in-part of Ser. No. 223,435, Apr. 27, 1951.

[51] Int. Cl.² .............................................. H01B 1/00
[52] U.S. Cl. .................................... 252/501; 252/518; 423/92; 423/561 R
[58] Field of Search ............... 23/134; 423/92, 561 R; 252/501, 518; 427/74

[56] References Cited

U.S. PATENT DOCUMENTS

| 2,448,516 | 9/1948 | Cashman | 423/561 R X |
|---|---|---|---|
| 2,809,134 | 10/1957 | McIlvaine | 252/501 X |
| 2,868,736 | 1/1959 | Weinreich | 252/501 |
| 2,999,177 | 9/1961 | Null et al. | 252/501 X |
| 3,003,075 | 10/1961 | Krieger | 252/501 X |
| 3,005,970 | 10/1961 | Rocard et al. | 252/501 X |
| 3,017,296 | 1/1962 | Dunn et al. | 252/501 X |
| 3,026,218 | 3/1962 | Morgan | 252/501 X |
| 3,030,236 | 4/1962 | Cooperstein | 252/501 X |
| 3,595,690 | 7/1971 | Cooperstein | 423/561 R X |

OTHER PUBLICATIONS

Mellor, Comprehensive Treatise on Inorganic and Theoretized Chemistry, vol. 7, p. 783, (1927).
Kicinski — Chemistry and Industry — (1948), pp. 54–57.

*Primary Examiner*—Richard E. Schafer

EXEMPLARY CLAIM

1. The process of photosensitizing lead sulfide comprising adding a persulfate solution to intermixed solutions of thiourea, lead acetate and sodium hydroxide whereby activated lead sulfide is precipitated therefrom.

16 Claims, No Drawings

LEAD SULFIDE ACTIVATION PROCESS

This application is a continuation-in-part of applicant's patent application Ser. No. 311,949, filed Sep. 27, 1952, which was itself a continuation-in-part of applicant's patent application Ser. No. 223,435, filed Apr. 27, 1951.

This invention relates to a new and improved method for photosensitizing lead sulfide.

The principal object of this invention is to provide a simple and nonexacting process for synthesizing photosensitive lead sulfide without the application of the high-temperature heating and gaseous oxidation steps heretofore required.

The photoconductive properties of natural lead sulfide or galena have been known for quite some time. However, the attainment of an activated form of lead sulfide having a practical sensitivity value, as well as other desirable properties, is a relatively recent development owing in a large part to the requirements of the armed forces for a radiation detector responsive to farther infrared radiant energy. Photoconductive cells employing activated lead sulfide provide a response in the range of 1 to 4 microns wave length, and inasmuch as the spectral energy in this range is invisible to the eye, this type of cell has proven itself an extremely useful radiation detector in communication systems wherein security is important. Lead sulfide photoconductive cells have also proven useful for low-temperature radiation detection, in pyrometers, and in devices for maintaining relative positions between moving aircraft and ships without having the radiation source detected by unauthorized stations.

Lead sulfide in its natural state exhibits negligible photosensitive properties. It is only when it is activated with oxygen that it displays the characteristics that make it, perhaps, the most valuable and important type of photoconductive material. Generally speaking, the activation procedures of the prior art have comprised heating lead sulfide in a controlled atmosphere of oxygen or air. The lead sulfide activated by this process could be that prepared by a variety of chemical synthesizing processes or from natural galena. One commonly used process for preparing lead sulfide synthetically comprised treating lead acetate or lead nitrate which had been dissolved in distilled water with hydrogen sulfide gas until lead sulfide was precipitated out. The precipitated lead sulfide was then filtered from the solution and fused and crushed to a desired size. Another method for preparing lead sulfide synthetically involved the mixing of specified solutions of lead acetate, thiourea, and sodium hydroxide with a resulting precipitation of lead sulfide. This latter method was particularly useful in that the lead sulfide was precipitated from the solution in such a manner as to adhere evenly and smoothly upon any object located within the bath of the intermixed solutions. This process could, therefore, be used in many instances to deposit lead sulfide directly to the walls of cell envelopes with a consequent economy in cell fabrication. When galena was used as a source of lead sulfide, the crystals of commercially available galena were crushed to a powder form without the necessity for purification steps.

In any event, the lead sulfide prepared by any of the aforementioned processes was unsatisfactory for photoresponsive purposes because of its negligible sensitivity. Consequently, it was activated by heating the lead sulfide, preferably in a low-pressure oxygen atmosphere. For example, a few milligrams of lead sulfide, as prepared above, were placed in an open cell envelope and gently heated with an oxygen flame to partially oxidize the powder before evaporating and condensing the lead sulfide upon a supporting surface within the cell. This supporting surface usually contained a grid or electrode structure for making electrical connections to the applied photoconductive area. This head-treatment step was accomplished with the cell in an open atmosphere of air and usually continued for several minutes. Thereafter, the cell was coupled to a vacuum system, and a controllable air leak was provided so that a pressure of 400 to 500 microns of air could be maintained within the cell during the activation process. While the cell was held at this pressure, the lead sulfide powder which had been loosely placed in the envelope was shaken about so that it was directly beneath the grid surface to which the lead sulfide was to be deposited, the cell being in a horizontal position. The adjacent envelope wall was then heated by a flame to cause the lead sulfide powder to sublime or evaporate and be condensed on the grid structure. After the photosensitive material had thus been deposited upon the grid, the flame was removed, the air leak turned off, and the cell cooled down with the vacuum pump pulling a full vacuum. The cell was then sealed, and the fabrication, including activation of the cell, was then complete.

The application of activated lead sulfide to a supporting structure has also been accomplished by other photosensitizing procedures wherein inactivated lead sulfide was evaporated from a source plate by the heat from an electrically-energized coil. This heating step was performed within a vessel having the desirable low-pressure oxygen atmosphere.

In view of the foregoing, it can be readily appreciated that a process which could synthesize activated lead sulfide directly and without the heating of inactivated lead sulfide in a low-pressure oxygen atmosphere, would offer a great many advantages over the prior art, especially if this process were also adaptable to the direct application of activated lead sulfide to photoconductive cell envelopes and supporting structures. Accordingly, the novel activation process of this invention comprises, in its broadest aspect, the application of an activating agent to and within any of the prior-art solutions for precipitating lead sulfide where the resulting precipitate is activated lead sulfide which can be given an additional sensitization by aging or subjecting to a relatively low-temperature bake. For the highest sensitivity, this activating agent should be intermixed with the prior-art solutions for precipitating lead sulfide prior to the actual precipitation of lead sulfide; however, addition during actual precipitation will result in activation but to a lesser degree. The resulting precipitate is activated lead sulfide which is capable of direct inclusion into photoconductive cells or which is capable of an extremely high degree of sensitization if subjected to aging or low-temperature baking.

If the preferred form of the process of this invention is used, which is to be described in detail immediately hereinafter, the synthesis, activation, and application of lead sulfide to most photoconductive cell structures can be accomplished by a simple and direct sequence of operations.

This process contemplates the utilization of a prior-art stock solution for the synthesis of lead sulfide by precipitation, namely, and merely as an example:

(1) 350 ml. of 0.0500 molar solution (aqueous) of thiourea or substituted products thereof;
(2) 700 ml. of 0.0250 molar solution (aqueous) sodium plumbite (prepared from lead acetate and sodium hydroxide).

Or, as a second satisfactory process for precipitating lead sulfide:
(3) 350 ml. of 0.0500 molar solution (aqueous) of thiourea or substituted products thereof;
(4) 350 ml. of 0.0500 molar solution (aqueous) of lead acetate or lead nitrate;
(5) 350 ml. of 0.500 molar solution (aqueous) of sodium hydroxide.

It has long been known that if solutions (1) and (2) or (3), (4), and (5) above are intermixed in any order, lead sulfide will precipitate out of the solution at a temperature of 35° C, for example, in such a manner as to form an even and relatively smooth layer on the side walls and at the bottom of the liquid-containing vessel or on the walls of any object located within the bath. It has, therefore, been customary to locate within this vessel the photoconductive cell envelopes or other structures to which it was desired to apply lead sulfide so that the precipitate would adhere directly thereto. If desirable, the adhering coat of lead sulfide was confined to a particular envelope or supporting structure area by conventional masking procedures. Thereafter, the envelopes or structures were removed and activated by heat treatment and oxidation.

If immediately prior to the actual precipitation of lead sulfide from the intermixed precipitating solution, 350 ml. of 0.0100 molar solution (aqueous) potassium persulfate or hydrogen peroxide or sodium perborate or any other agent capable of liberating relatively abundant quantities of nascent oxygen is added thereto, the lead sulfide will precipitate therefrom in the usual manner but in an activated form capable of direct use within a cell or of additional sensitization by aging or low-temperature baking. The precipitating solution and the activating agent are preferably mixed at a temperature of 35° C and stirred for one hour, during which time deposition occurs. Thereafter, the cell envelopes or supporting structures are removed from the solution and remaining steps for the fabrication of the cells are completed, omitting, of course, any activation steps. Improved characteristics are obtained, however, if the deposited films are further processed by heating at approximately 100° C for 1 hour. This heating step is preferably accomplished in vacuo in order to minimize the deleterious effects of atmospheric humidity. In the alternative, similar improved characteristics can be obtained by aging the deposited film in vacuo or in an atmosphere devoid of excessive humidity.

From a generic aspect, the optimum amount of the persulfate ion, perborate ion, nascent oxygen from the hydrogen peroxide, expressed in moles, added to any of the prior art liquid solutions for precipitating lead sulfide should be ½ to 1/100 of the theoretical amount of lead sulfide also expressed in moles in the bath, the theoretical amount of lead sulfide being that amount which would be formed if there were a total conversion of the lead and sulfur precipitating compounds to lead sulfide. If the amount of persulfate ion, perborate ion, or nascent oxygen produced from the hydrogen peroxide lies outside the aforementioned limits, the photosensitivity of the deposited lead sulfide, while present, is reduced.

While it has been stated that the order for intermixing solutions (3), (4), and (5) above is immaterial, a preferred sequence, known in the prior art, is to add the lead acetate solution to the thiourea solution, and thereafter add the sodium hydroxide solution. Shortly after the addition of the sodium hydroxide solution, lead sulfide starts to precipitate out. It has been found that the lead sulfide precipitate will attain the highest sensitivity if the oxygen-activating solution is added immediately after the addition of the sodium hydroxide. It should be understood, however, that notwithstanding the addition of this solution after the formation of precipitate, activation will take place but only to a lesser extent.

Satisfactory results have also be obtained by taking 350 ml. of 0.1328 molar solution (aqueous) of thiourea and 700 ml. of 0.0664 molar solution (aqueous) of sodium plumbite, and mixing as outlined above, at a temperature of 20° C, one of the following:

350 ml. of 0.01328 molar solution (aqueous) of urea peroxide;
350 ml. of 0.0398 molar solution (aqueous) of sodium peroxide;
350 ml. of 0.00664 molar solution (aqueous) of sodium percarbonate;
350 ml. of .0398 molar solution (aqueous) of potassium permanganate;
350 ml. of .0398 molar solution (aqueous) of sodium hypochlorite.

Another satisfactory process has been to use 350 ml. of 0.05 molar solution (aqueous) of thiourea, and 700 ml. of .025 molar solution of sodium plumbite, and mixing as outlined above, at a temperature of 50° C, 350 ml. of 0.004 molar ceric ammonium nitrate.

As with the prior-art activation process involving heating and oxidation, the details of the physical and chemical reactions within the molecular structure of lead sulfide during activation are not definitely known. The results of numerous observations and the study of empirical data concerning the novel process of this invention indicate that a single characteristic is required of the activating agent, namely, that abundant quantities of nascent oxygen be liberated from the agent in solution or from an occluded particle within the precipitated lead sulfide. For example, the reaction of potassium persulfate in water is as follows:

$$K_2S_2O_8 + H_2O \rightarrow 2KHSO_4 + (O)$$

It should be noted, however, that the nascent oxygen is not necessarily liberated within the solution. In fact, it appears that initially ionic particles formed from the activating agent are occluded within the precipitate and thereafter nascent oxygen is liberated while the precipitate is within the solution or from the subsequent decomposition of these ionic particles after withdrawal of the deposited film from the solution. It seems certain that the greater part of the activation of the precipitated lead sulfide is due to the occlusion of the ionic particles of the activating agent in an undecomposed form within the lead sulfide precipitate, and after removal of this precipitate from the deposition bath, decomposition which can be brought upon by a relatively low-temperature bake or aging raises the ultimate sensitivity to a very high relative value. The undecomposed occluded agent apparently liberates oxygen slowly at room temperature of 25° C. The decomposition proceeds more rapidly at 100° C, whereby full sensitivity is reached after approximately one hour baking time. As noted previously, this heating step is preferably accomplished in vacuo in order to minimize the harmful effects of atmospheric humidity. This low-temperature bake merely accelerates the time necessary for decomposition of the occluded particles whereby nascent oxygen is freely liberated to form an activated lead-sulfur-oxygen compound which is highly photoconductive. However, inasmuch as decomposition occurs at room temperature, the same result can be attained by aging the precipitated lead sulfide surface for a period approximating one week. Here again, the aging step should be preferably performed in an atmosphere devoid of excessive water vapor and humidity.

There is an initial difference between the low-temperature bake utilized herein and the prior-art heating and gaseous oxidation steps heretofore noted. In the prior-art method, molecular oxygen is caused to react with lead sulfide by raising the temperature of the lead sulfide to a relatively high temperatue of 500° to 600° C, which causes a charge in the size of the lead sulfide crystallites with a consequent increase in noise level. A reaction between lead sulfide and nascent oxygen apparently does not change the crystallite size to such a great extent and therefore provides greater uniformity and a relatively small cell noise. Moreover, in the low-temperature bake, there is no reaction with molecular oxygen.

It should therefore be understood that the method hereof contemplates that an activating agent be applied to any solution for precipitating lead sulfide whereby at some ultimate step relatively large quantities of nascent oxygen are liberated to form a lead-sulfur-oxygen compound. Accordingly, it readily follows, for example, that any persulfate or perborate which is soluble in water, such as sodium, lead, or lithium, or any chemical compound which can be occluded in lead sulfide deposited from a chemical bath, with a subsequent decomposition to yield nascent oxygen to the lead sulfide, will produce the activation of lead sulfide.

I claim:

1. The process of photosensitizing lead sulfide comprising adding a persulfate solution to intermixed solutions of thiourea, lead acetate and sodium hydroxide whereby activated lead sulfide is precipitated therefrom.

2. In the process of producing photosensitive films of lead sulfide by deposition from an aqueous solution having a pH of at least 7 and containing a soluble bivalent lead salt and a thiourea, the improvement which comprises depositing said lead sulfide in the presence of a peroxy compound and collecting the precipitate thus formed.

3. The process according to claim 2 comprising the further step of heating said precipitate at a temperature lower than a maximum temperature which lies in the range of 140° to 200° C.

4. The process according to claim 3 wherein said heating step is accomplished in a dry medium.

5. The process according to claim 3 wherein said heating step is accomplished in a vacuum.

6. The process according to claim 2 comprising the further step of aging said precipitate.

7. The process according to claim 2 wherein said peroxy compound is a persulfate.

8. The process according to claim 7 wherein the amount of persulfate added is such that the concentration of the persulfate ion expressed in moles is 0.50 to 0.01 of the theoretical amount of lead sulfide which would be formed if there were a total conversion of lead and sulfur precipitating compounds to lead sulfide.

9. The process according to claim 7 wherein said aqueous solution contains sodium hydroxide and wherein said soluble bivalent lead salt is lead acetate.

10. The process according to claim 2 wherein said peroxy compound is a perborate.

11. The process according to claim 10 wherein the amount of perborate added is such that the concentration of the perborate ion expressed in moles is 0.50 to 0.01 of the theoretical amount of lead sulfide which would be formed if there were a total conversion of lead and sulfur precipitating compounds to lead sulfide.

12. The process according to claim 2 wherein said peroxy compound is hydrogen peroxide.

13. The process according to claim 12 wherein the amount of hydrogen peroxide added is such that the concentration of the oxygen atom expressed in gram atomic weight which can be theoretically liberated from said hydrogen peroxide is 0.50 to 0.01 of the theoretical amount of lead sulfide which would be formed if there were a total conversion of lead and sulfur precipitating compounds to lead sulfide.

14. In the process of producing photosensitive films of lead sulfide by deposition from a solution containing a lead salt, the improvement which comprises depositing said lead sulfide films in the presence of an activating agent of the class which produces gaseous oxygen when placed in acid solutions.

15. In the process of producing photosensitive films of lead sulfide by deposition from a solution containing a soluble bivalent lead salt, the improvement which comprises depositing said lead sulfide films in the presence of an activating agent of the class which produces gaseous oxygen when placed in acid solutions.

16. In the process of producing photosensitive films of lead sulfide by deposition from a solution containing a soluble bivalent lead salt, the improvement which comprises depositing said lead sulfide films in the presence of an activating agent belonging to the class consisting of potassium persulfate, hydrogen peroxide, sodium perborate, urea peroxide, sodium peroxide, sodium percarbonate, potassium permanganate, sodium hypochlorite, and ceric ammonium nitrate.

* * * * *